US006387776B1

(12) United States Patent
Yi et al.

(10) Patent No.: US 6,387,776 B1
(45) Date of Patent: May 14, 2002

(54) METHOD FOR FORMING TRENCH ISOLATION REGIONS

(75) Inventors: Jong-Seung Yi; Tae Wook Seo, both of Kyungki-do; Jin-Ho Jeon, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/520,716

(22) Filed: Mar. 8, 2000

(30) Foreign Application Priority Data

Sep. 22, 1999 (KR) .............................. 99-40951

(51) Int. Cl.[7] .............................................. H01L 21/76
(52) U.S. Cl. ...................... 438/435; 438/296; 438/424
(58) Field of Search ................................ 438/296, 424, 438/435, 439

(56) References Cited

U.S. PATENT DOCUMENTS

| | | | | |
|---|---|---|---|---|
| 5,447,884 A | * | 9/1995 | Fahey et al. | 438/435 |
| 5,502,006 A | * | 3/1996 | Kasagi | 438/437 |
| 5,716,890 A | * | 2/1998 | Yao | 438/624 |
| 5,726,090 A | * | 3/1998 | Jang et al. | 438/435 |
| 6,100,163 A | * | 8/2000 | Jang et al. | 438/437 |
| 6,180,490 B1 | * | 1/2001 | Vassiliev et al. | 438/424 |
| 6,184,091 B1 | * | 2/2001 | Gruening et al. | 438/270 |
| 6,197,658 B1 | * | 3/2001 | Jang | 438/424 |
| 6,197,677 B1 | * | 3/2001 | Lee et al. | 438/623 |

FOREIGN PATENT DOCUMENTS

TW 322618 A * 12/1997 .......... H01L/21/76

OTHER PUBLICATIONS

Vossen and Kern Thin Film Processing II Acedemic Press 1991 p. 323.*
S. Wolf Silicon Processing for the VSLI Era vol. 3 Lattice press 1995 p. 372.*

* cited by examiner

Primary Examiner—Charles Bowers
Assistant Examiner—David S. Blum
(74) Attorney, Agent, or Firm—Volentine Francos, PLLC

(57) ABSTRACT

A method for forming trench isolation regions in a semiconductor device reliably electrically isolates a device and enhances a device density. The method for forming trench isolation regions includes forming a trench on a surface of a semiconductor device with a predetermined depth; forming a nitride liner layer on the surface of the semiconductor including the trench, forming a gas distribution region which is uniformly distributed on the nitride liner layer; and forming an insulation layer by filling the trench after said forming of the gas distribution region. The gas distribution region is preferably formed by introducing an ozone gas. The insulation layer is preferably formed by simultaneously introducing ozone gas and TEOS(Tetra Ethyl Ortho-Silicate) chemical.

17 Claims, 8 Drawing Sheets 52
54

52
54

METHOD FOR FORMING TRENCH ISOLATION REGIONS

CROSS-REFERENCES TO RELATED APPLICATIONS

The present application claims priority under 35 U.S.C. §119 to Korean Patent Application No. 99-40951 filed on Sep. 22, 1999, the entire contents of which are hereby incorporated by reference for all purposes.

BACKGROUND OF THE INVENTION

1. Field of the invention

The present invention relates to a method for forming a semiconductor device, more particularly, to a method for forming trench isolation regions in a semiconductor device, which electrically isolates the semiconductor device and increases the density at which the semiconductor devices can be formed.

2. Description of the Related Art

Device isolation techniques play an important role in the design and performance of highly integrated semiconductor circuits by electrically isolating regions and devices therein from adjacent devices and regions. As the design of theses highly integrated semiconductor circuits becomes smaller and more detailed, the isolation techniques have also developed to meet these demands. LOCal Oxidation of Silicon (LOCOS) and Shallow Trench Isolation (STI) techniques are commonly used for forming isolation regions in a semiconductor substrate.

The LOCOS technique has been widely used because it is relatively simple. However, the LOCOS technique has some limitations. In particular, when applied to highly integrated devices such as 256M DRAM devices, oxide thinning and punch-through parastics may become severe.

FIGS. 1a–1f illustrate schematic cross-sectional views of intermediate structures illustrating a method of forming trench isolation regions according to the conventional art, i.e., STI technique. As shown in FIG. 1a, a pad oxide pattern 12 and a silicon nitride pattern 14 are formed by patterning a pad oxide layer and a silicon nitride layer in order to expose a part of a semiconductor substrate as a trench isolation region.

Thereafter, as shown in FIG. 1b, a trench 16 is formed by an etching using the silicon nitride pattern 14 as an etching mask with a depth of about 3,000 through 5,000 Å.

Thereafter, as shown in FIG. 1c, a silicon nitride liner layer 18 is formed on the semiconductor substrate including the trench 16 by using a Chemical Vapor Deposition (CVD) apparatus (not shown).

Thereafter, as shown in FIG. 1d, an insulation material layer 20, as a High Temperature-Undoped Silicate Glass (HT-USG) material, is formed on the silicon nitride liner layer 18 in the trench 16 by simultaneously introducing ozone gas and Tetra Ethyl Ortho-Silicate (TEOS) chemical in the CVD apparatus Thereafter, as shown in FIG. 1e, a first insulation layer 22 is formed by etching the insulation layer 20 by well-known Chemical-Mechanical Polishing (CMP) in order to expose the surface of the silicon nitride layer 14.

On the other hand, as shown in FIG. 1f, a second insulation layer 24 is formed on the silicon nitride liner layer 18 of the finally fabricated semiconductor substrate 10.

At an interface between trench isolation region including the silicon nitride liner layer 18 formed on the trench 16 and the second insulation layer 24 of HT-USG material, a part of the second insulation layer 24 is separated, resulting in damages. The encircled area labeled "A" in FIG. If is shown in detail in FIG. 3a. As can be seen therein, a damaged part of the trench isolation region for isolating the field region and the active region is shown shaded. This damaged part will be explained relative to FIG. 3b below in the discussion of the details of the present invention.

As described above, the damage of a resultant insulation layer is due to the stress arising from the differences between the coefficient of thermal expansion at the interface. The damage can also arise from using an HT-USG material having relatively low density from an ion implantation process. That is, from the beginning of the formation of the isolation region, the insulation layer does not uniformly grow on the silicon nitride liner layer, so that the insulation layer is separated at the interface of the silicon nitride liner layer and the insulation layer. Accordingly, an electrical characteristic of the device damaged like this deteriorates and a leakage current is produced at the damaged part. Accordingly, the device may be operating abnormally. Finally, the device may have a severe problem, reducing the reliability of the semiconductor device.

U.S. Pat. No. 5,882,982 discloses an etching process for forming a trench in the semiconductor substrate which includes introducing several types of additional gases under predetermined conditions. U.S. Pat. No. 5,885,883 discloses a technique for obtaining an insulation layer having a uniform density including filling the trench and forming a reinforcing oxide layer on the sidewall of the trench in order. However, neither of these patents disclose a technique capable of obtaining a trench isolation region having a uniform density by only controlling the conventional gases, i.e., without introducing other additional gases.

SUMMARY OF THE INVENTION

The present invention is therefore directed to method for forming trench isolation regions which substantially overcomes one or more of the problems due to the limitations and disadvantages of the related art.

An object of the present invention is to solve the problems produced in the STI technique as explained above and to provide an improved method for forming a trench isolation region in which a uniform gas distribution region on the trench (at the state that a silicon nitride liner layer is formed on the trench) is formed in order to grow an insulation layer having a uniform density. Thereby, the damage is prevented and the insulation layer formed on the silicon nitride liner layer is not separated at the interface.

These and other objects, features and advantages of the present invention are provided by a method of forming trench isolation regions which include forming a trench on a surface of a semiconductor device with a predetermined depth; forming a nitride liner layer on the surface of the semiconductor including the trench; forming a gas distribution region which is uniformly distributed on the nitride liner layer; and forming an insulation layer by filling the trench after said forming of the gas distribution region.

The gas distribution region is preferably formed by introducing an ozone gas. The gas distribution region is formed by introducing ozone gas of 5,000 sccm during about three seconds.

After forming the gas distribution region, the filling of the trench is preferably formed by simultaneously introducing ozone gas and TEOS(Tetra Ethyl Ortho-Silicate) chemical. Even more preferably, ozone gas of about 5,000 sccm and TEOS chemical of about 80 mg until 100 seconds from the start are simultaneously introduced.

After forming the gas distribution region the filling of the trench is achieved that according to simultaneously introducing ozone gas and the TEOS chemical, a surface reaction between the gas distribution region and the ozone gas and TEOS chemical is started at the interface and grown, so that a layer having a uniform density is formed.

Other objects and features of the present invention will become more apparent and the invention itself will best be understood by referring to the following description and embodiments taken in conjunction with the accompanying drawings.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

Figure 1A:
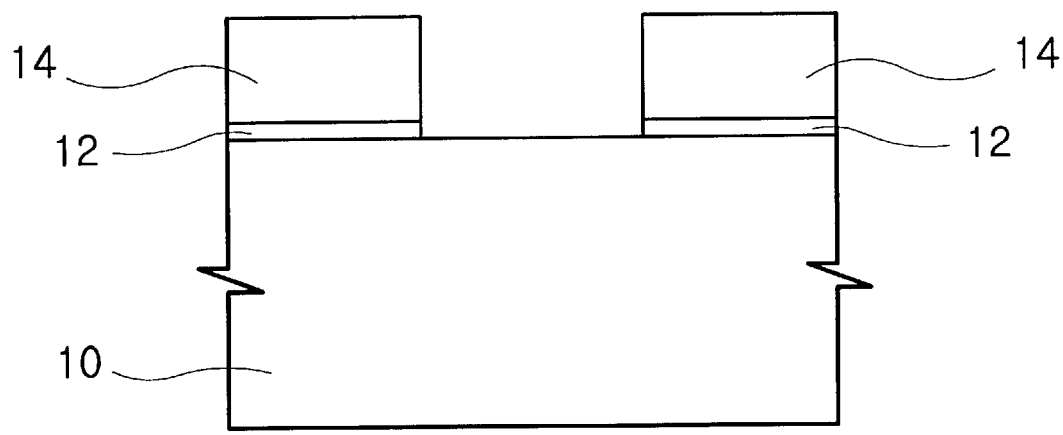
FIGS. 1a–1f illustrate schematic cross-sectional views of intermediate structures illustrating a method of forming trench isolation regions according to the conventional art, i.e., a STI technique.
Figure 1B:
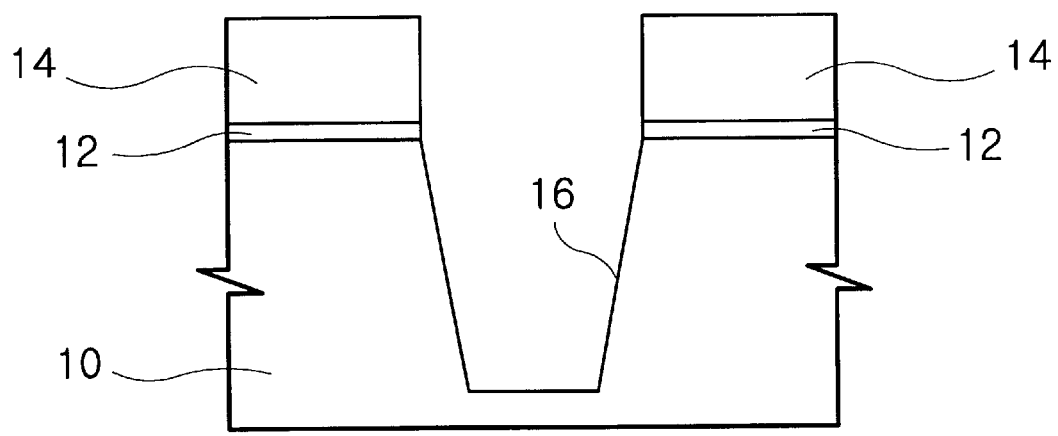
Figure 1C:
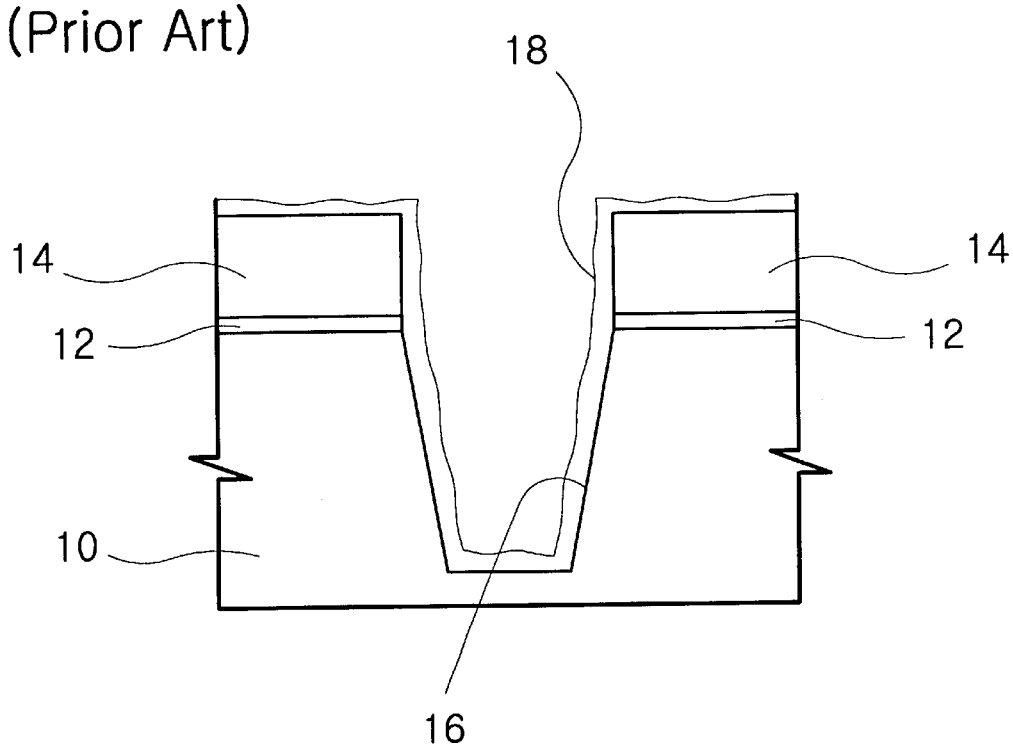
Figure 1D:
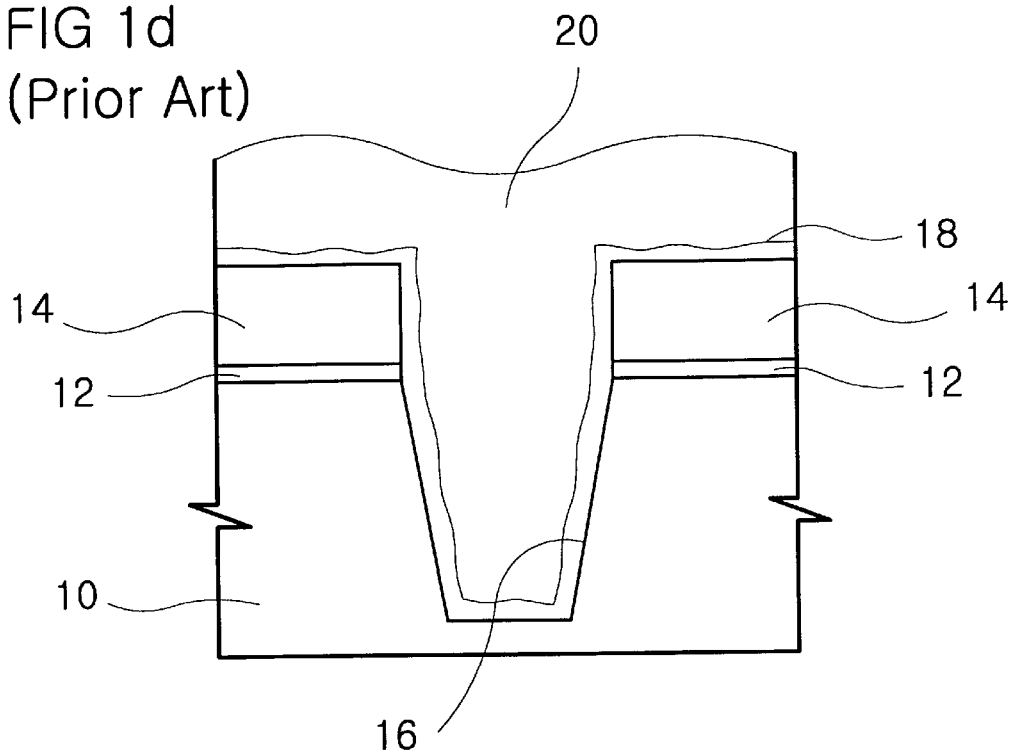
Figure 1E:
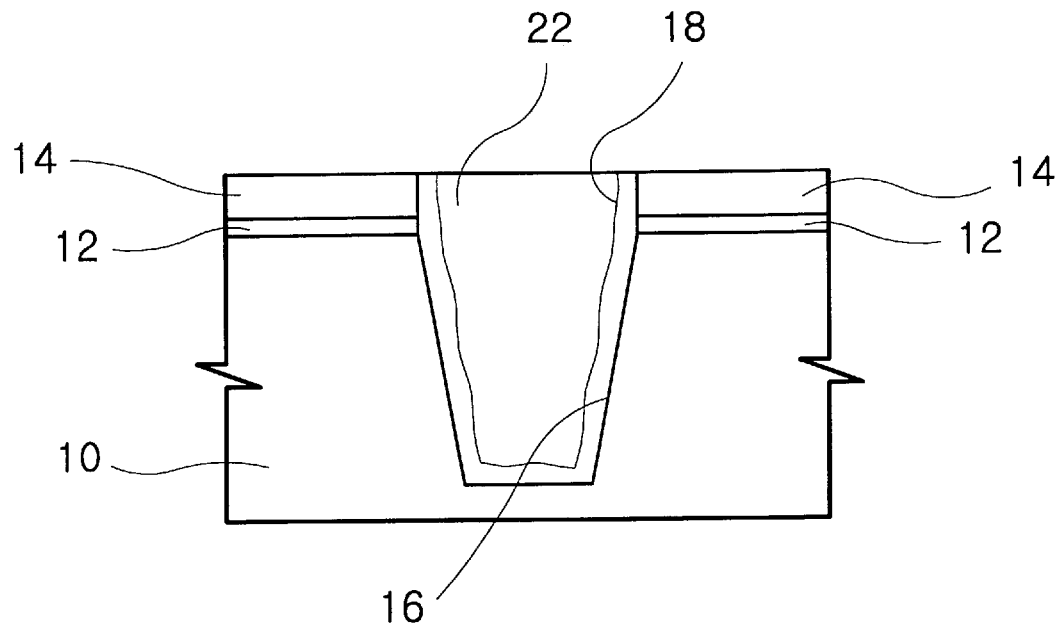
Figure 1F:
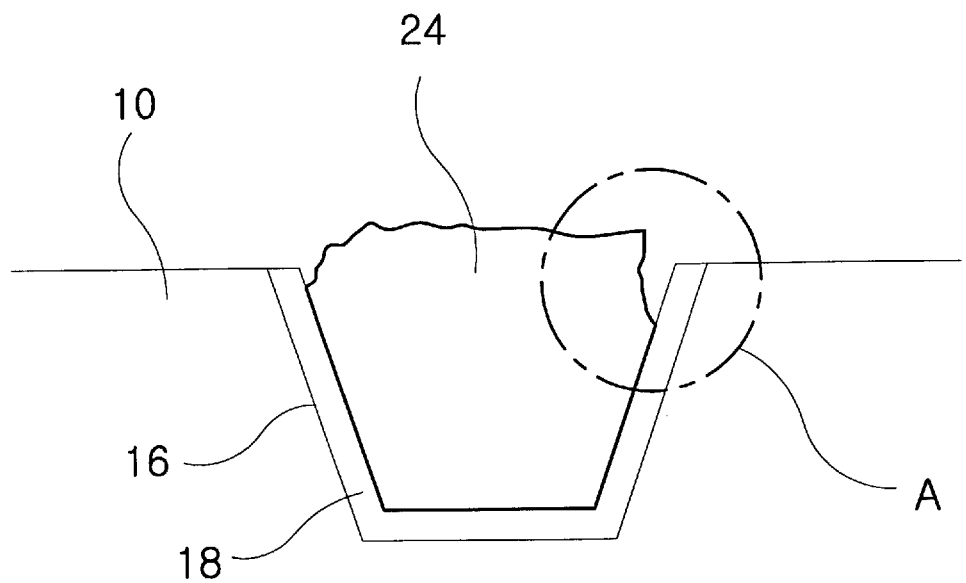
Figure 2A:
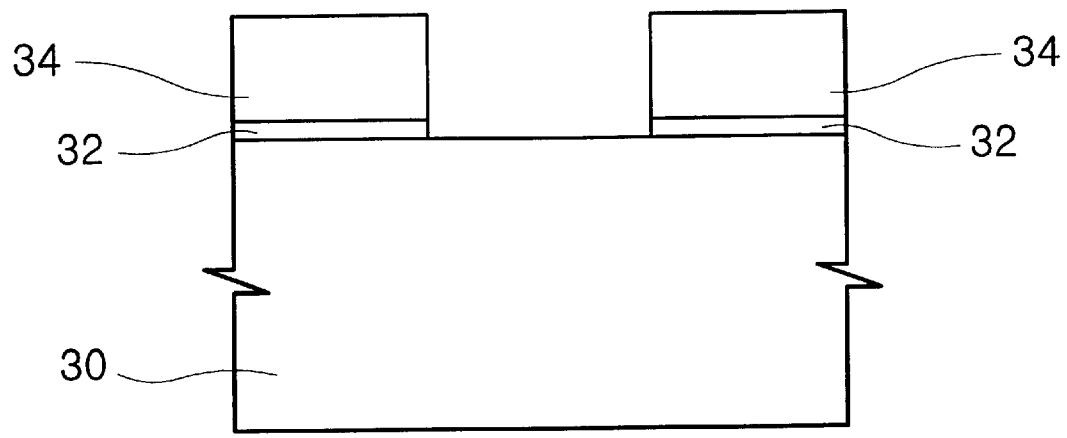
FIGS. 2a–2g illustrate schematic cross-sectional views of intermediate structures illustrating a method of forming trench isolation regions according to the present invention.

FIGS. 2a–2g illustrate schematic cross-sectional views of intermediate structures illustrating a method of forming trench isolation regions according to the present invention. As shown in FIG. 2a, a pad oxide pattern 32 and a silicon nitride pattern 34 are formed by patterning a pad oxide layer and a silicon nitride layer in order to expose a part of a semiconductor substrate as a trench isolation region.

Figure 2B:
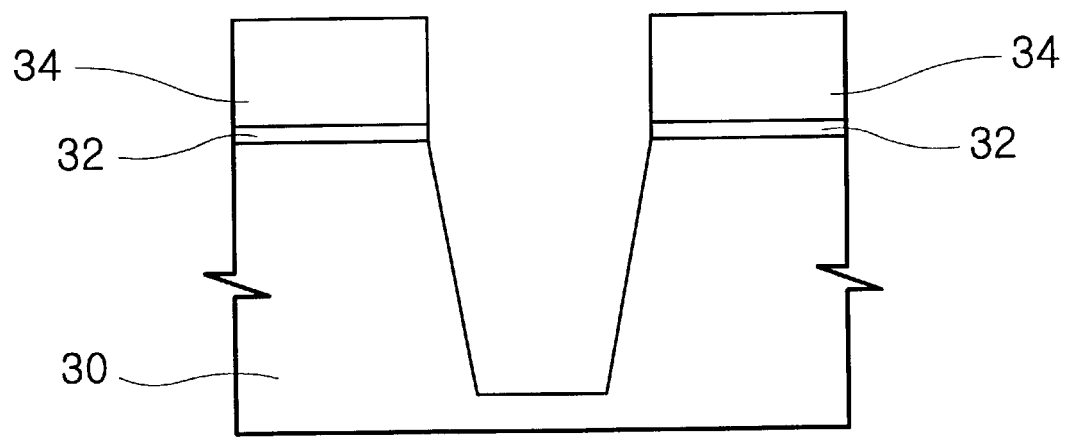

Thereafter, as shown in FIG. 2b, a trench 36 is formed by an etching using the silicon nitride pattern 34 as an etching mask with a depth of about 3,000 through 5,000 Å.

Figure 2C:
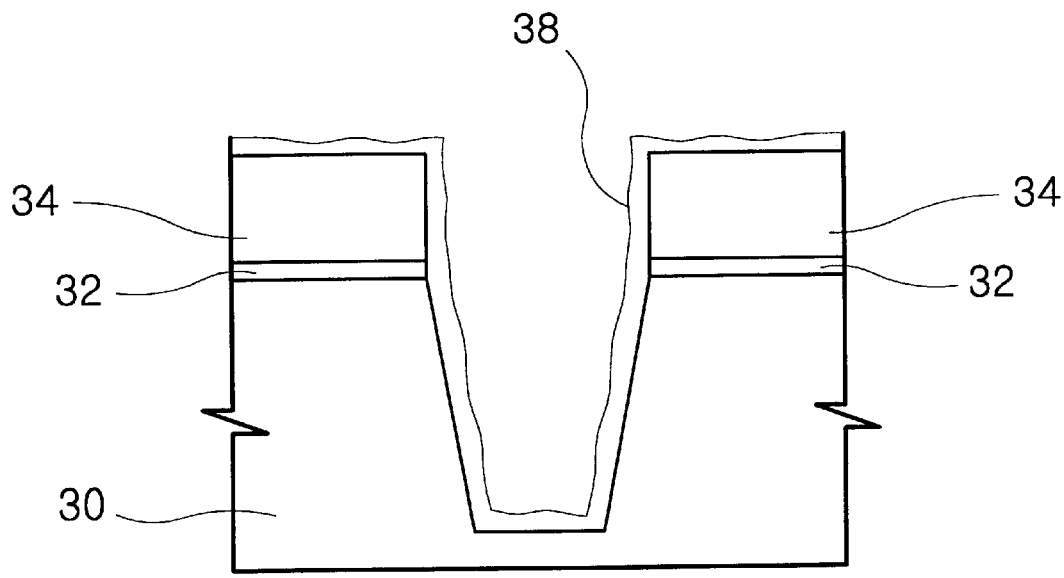

Thereafter, as shown in FIG. 2c, a silicon nitride liner layer 38 is formed on the semiconductor substrate including the trench 36 by using a CVD apparatus (not shown).

Figure 2D:
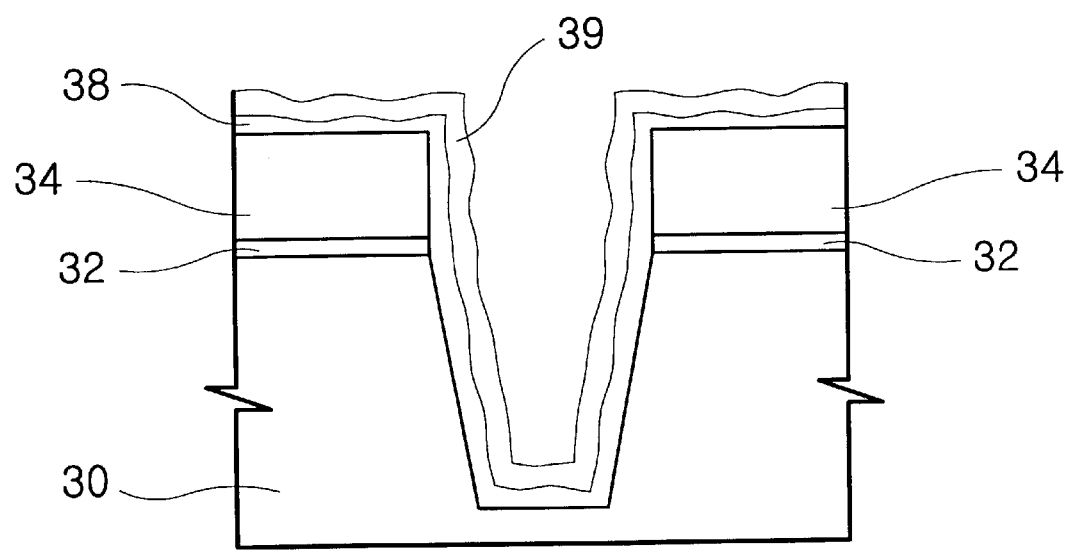

Thereafter, as shown in FIG. 2d, a gas distribution region 39 is formed on the silicon nitride liner layer 38 by introducing ozone gas into the CVD apparatus. This is a specific process in the present invention in which ozone gas is introduced for one to three seconds and distributed uniformly on the nitride liner layer 38. The distributed ozone gas does not react, i.e., the ozone gas is not separated into oxygen, so that a gas distribution region is maintained.

Figure 2E:
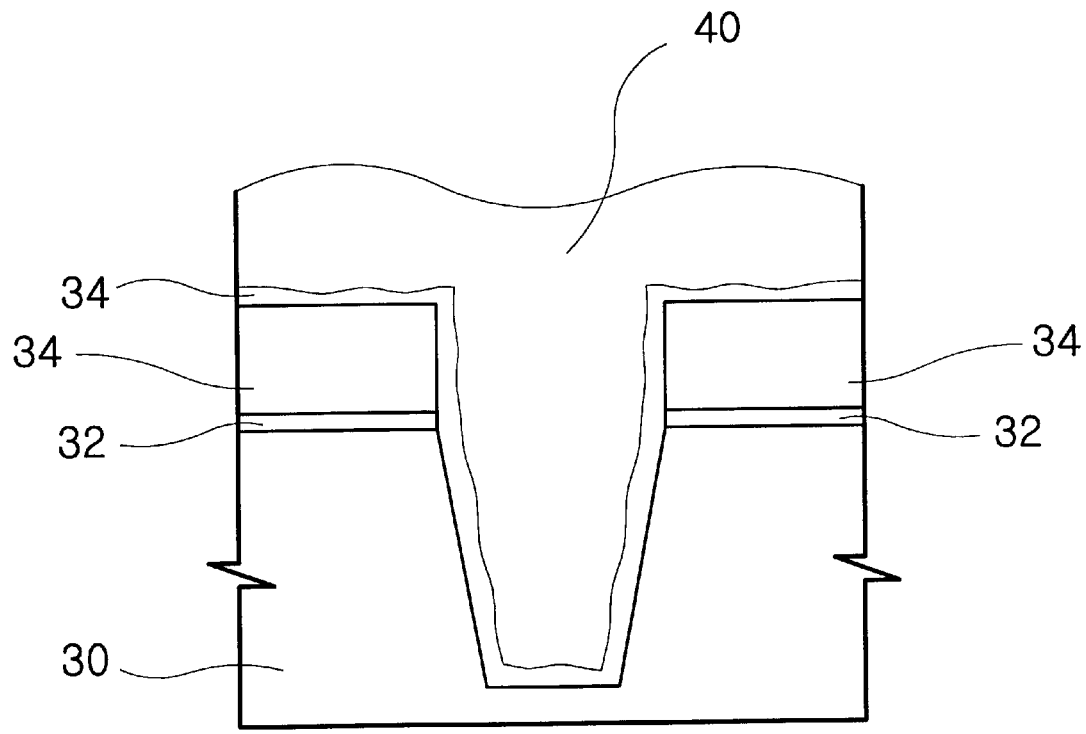

Thereafter, as shown in FIG. 2e, an insulation material layer 40, to serve as a HT-USG material, is formed on the silicon nitride liner layer 38 in the trench 36 by simultaneously introducing ozone gas and TEOS chemical in the CVD apparatus. This process is operated continuously from one to one hundred seconds after the above process of FIG. 2d. At this time, at the process of FIG. 2d, a reaction is started at the surface of the gas distribution region 39 formed uniformly by introducing ozone gas, so that a uniform USG layer is obtained. The insulating layer fills the trench 36.

Figure 2F:
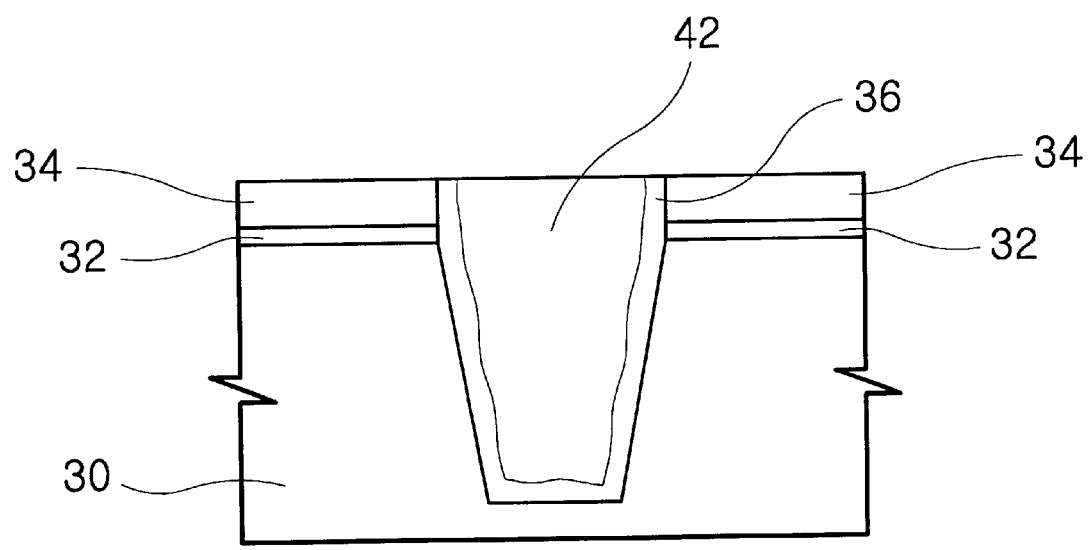
Figure 2G:
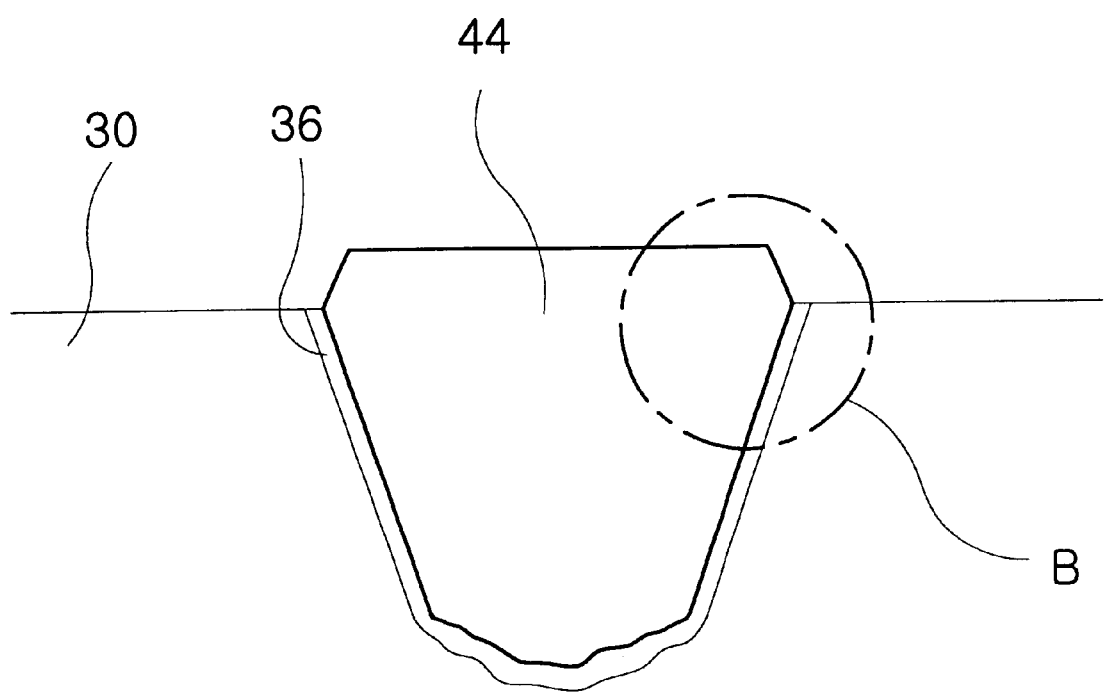

Thereafter, as shown in FIG. 2f, a first insulation layer 42 is formed by etching the insulation material layer 40 until the surface of the nitride layer 34 is exposed. Thereafter, a second insulation layer 44 is formed by removing the nitride layer pattern 34 and the pad oxide layer pattern 32, so that a trench isolation region is formed, as electrically isolated region, which is constructed by a nitride liner layer 38 and the second insulation layer 44.

Figure 3A:
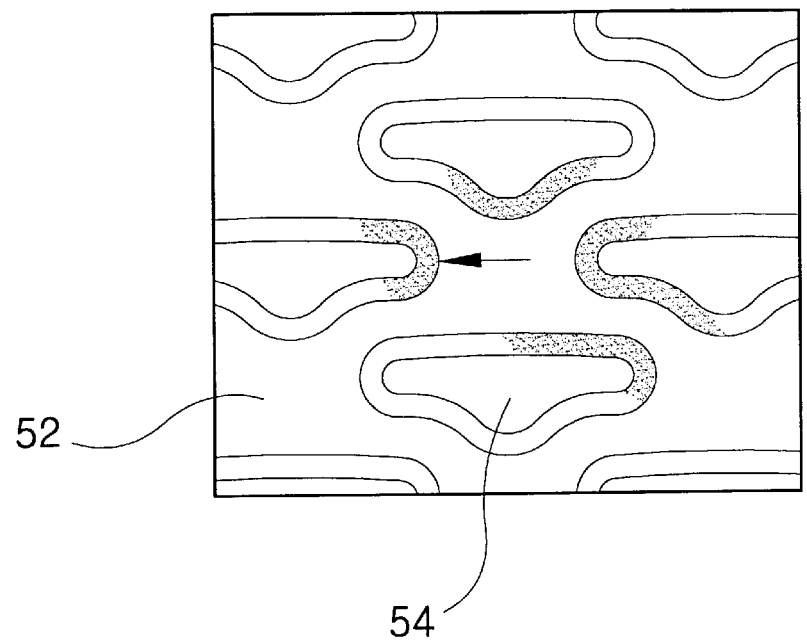
FIGS. 3a and 3b illustrate enlarged views of active regions and field regions of a semiconductor device of FIGS. 1f and 2g, respectively, by SEM photograph.
Figure 3B:
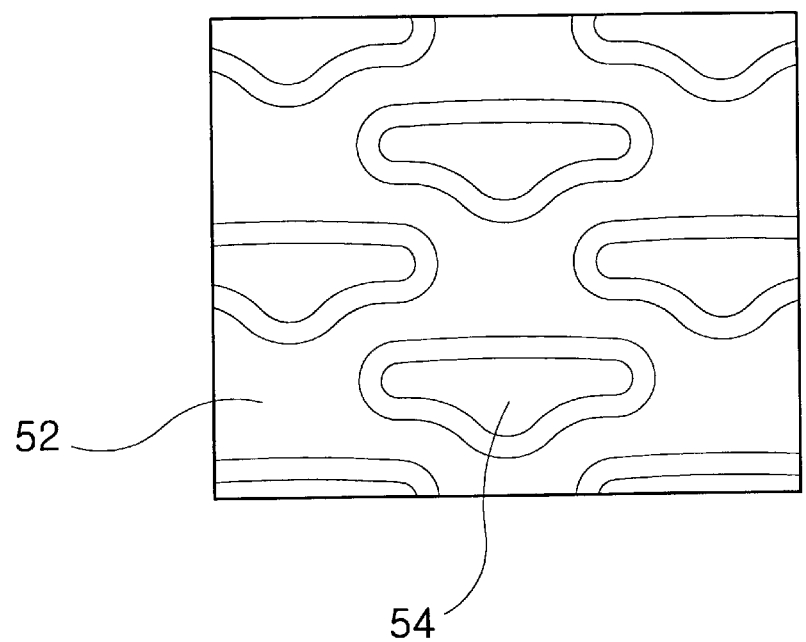

The encircled region labeled B in FIG. 2f is shown in detail in FIG. 3b. Any damaged part of the trench isolation region for isolating the field region and the active region is shaded. As can be seen in FIG. 3b, in a trench isolation region formed at an interface between a field region 52 and an active region 54, there is no damage at B. Comparing FIG. 3b and FIG. 3a, there is a distinct difference between the present invention and the conventional art. That is, according to the present invention, a trench isolation region for isolating the field region 52 and the active region 54 is uniformly grown, so that isolation of the device is reliably accomplished. In contrast, according to the conventional art, as shown in FIG. 3a, for example, a portion of the trench isolation region indicated by an arrow, is shaded, which is evidence that there is a breakdown phenomenon. Because damaged parts such as the one indicated in FIG. 3a are scattered throughout the device, operation is faulty and the reliability of the device is deteriorated.

As described above, according to the present invention, when forming a trench isolation region, first, a gas distribution region is uniformly distributed and thereafter ozone gas and TEOS chemical are introduced simultaneously, so that a uniform trench isolation region is obtained. Accordingly, there is no a scratching phenomenon at the interface in the process for forming an isolation region. This, a leakage current phenomenon is not produced at this interface, improving electrical characteristics. Finally, the reliability of the semiconductor device of the present invention is increased compared to the conventional art.

According to the present invention, the trench isolation region which is constructed by a nitride liner layer and an insulation layer has increased adhesion, so that the trench isolation having a uniform density is obtained.

While the principles of this invention have now been made clear in the foregoing description, it will be immediately obvious to those skilled in the art that many modifications of structure, arrangement, proportion, the elements, material and components may be used in the practice of the invention which are particularly adapted for specific environments without departing from those principles. The appended claims are intended to cover and embrace any such modifications within the limits only of the true spirit and scope this invention.

What is claimed is:

1. A method for forming trench isolation regions comprising:
   forming a trench on a surface of a semiconductor device with a predetermined depth;
   forming a nitride liner layer on the surface of the semiconductor including the trench;
   forming a gas distribution region which is uniformly distributed on the nitride liner layer; and
   forming an insulation layer filling the trench after said forming a gas distribution region.

2. The method for forming trench isolation regions according to claim 1, wherein said forming the gas distribution region includes introducing ozone gas.

3. The method for forming trench isolation regions according to claim 2, wherein said introducing ozone gas includes introducing ozone gas of 5,000 sccm for up to about three seconds.

4. The method for forming trench isolation regions according to claim 1, wherein said forming of the insulation layer includes simultaneously introducing ozone gas and TEOS(Tetra Ethyl Ortho-Silicate) chemical.

5. The method for forming trench isolation regions according to claim 4, wherein after said forming the gas distribution region, the filling of the trench includes simultaneously introducing ozone gas of about 5,000 sccm and TEOS chemical of about 80 mg for at least one second.

6. The method for forming trench isolation regions according to claim 5, said simultaneously introducing ozone gas of about 5,000 sccm and TEOS chemical of about 80 mg for up to about one hundred seconds.

7. The method for forming trench isolation regions according to claim 4, wherein after forming the gas distribution region the filling of the trench is achieved that according to simultaneously introducing ozone gas and the TEOS chemical, a surface reaction between the gas distribution region and the ozone gas and TEOS chemical is started at the interface and grown, so that a layer having a uniform density is formed.

8. The method for forming trench isolation regions according to claim 4, wherein said forming the gas distribution region includes introducing ozone gas.

9. A method for forming trench isolation regions on a substrate, comprising:

forming a trench in a surface of the substrate;

forming a silicon nitride layer on the surface of the substrate, including the trench;

uniformly distributing a gas over the surface of the silicon nitride layer, wherein the gas does not react to deposit a layer on the nitride layer; and while the gas is uniformly distributed over the surface of the silicon nitride layer, starting a reaction to deposit an insulation layer filling the trench over the silicon nitride layer.

10. The method of claim 9, wherein the gas consists of ozone.

11. The method of claim 10, wherein the gas consists of ozone gas of 5000 sccm and is uniformly distributed over the silicon nitride layer for about three seconds before starting the reaction to deposit the insulation layer filling the trench over the silicon nitride layer.

12. The method of claim 9, wherein starting a reaction to deposit an insulation layer filling the trench over the silicon nitride layer includes simultaneously introducing ozone gas and Tetra Ethyl Ortho-Silicate (TEOS).

13. The method of claim 9, wherein the reaction is maintained for between one and one hundred seconds.

14. A method for forming trench isolation regions on a substrate, comprising:

forming a trench in a surface of the substrate;

forming a nitride layer on the surface of the substrate, including the trench;

in a chemical vapor deposition (CVD) apparatus, forming and maintaining a gas distribution region uniformly over the surface of the nitride layer; and while the gas distribution region is uniformly distributed over the surface of the nitride layer, simultaneously introducing ozone gas and Tetra Ethyl Ortho-Silicate (TEOS) into the CVD apparatus to deposit an insulation layer filling the trench.

15. The method of claim 14, wherein forming a gas distribution region uniformly over the surface of the nitride layer comprises introducing ozone gas into the CVD apparatus.

16. The method of claim 14, wherein the ozone gas and TEOS are introduced into the CVD apparatus for between one and one hundred seconds.

17. The method of claim 14 wherein the insulation layer is deposited directly on the nitride layer.

* * * * *